(12) United States Patent
Kang et al.

(10) Patent No.: US 8,612,804 B1
(45) Date of Patent: Dec. 17, 2013

(54) SYSTEM AND METHOD FOR IMPROVING WEAR-LEVELING PERFORMANCE IN SOLID-STATE MEMORY

(75) Inventors: Ho-Fan Kang, Irvine, CA (US); Cliff Pajaro, Costa Mesa, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 353 days.

(21) Appl. No.: 12/895,691

(22) Filed: Sep. 30, 2010

(51) Int. Cl.
*G06F 11/00* (2006.01)

(52) U.S. Cl.
USPC .................................. 714/42; 714/47.2

(58) Field of Classification Search
None
See application file for complete search history.

(56) References Cited

U.S. PATENT DOCUMENTS

| | | | |
|---|---|---|---|
| 6,016,275 A | 1/2000 | Han | |
| 6,230,233 B1 | 5/2001 | Lofgren et al. | |
| 6,594,183 B1 | 7/2003 | Lofgren et al. | |
| 6,732,221 B2 | 5/2004 | Ban | |
| 6,850,443 B2 | 2/2005 | Lofgren et al. | |
| 7,096,313 B1 | 8/2006 | Chang et al. | |
| 7,353,325 B2 | 4/2008 | Lofgren et al. | |
| 7,660,941 B2 | 2/2010 | Lee et al. | |
| 7,797,481 B2 * | 9/2010 | Lee et al. | 711/103 |
| 8,099,545 B2 * | 1/2012 | Biswas et al. | 711/103 |
| 8,239,614 B2 * | 8/2012 | Asnaashari et al. | 711/103 |
| 2003/0227804 A1 | 12/2003 | Lofgren et al. | |
| 2004/0080985 A1 | 4/2004 | Chang et al. | |
| 2005/0055495 A1 | 3/2005 | Vihmalo et al. | |
| 2006/0106972 A1 | 5/2006 | Gorobets et al. | |
| 2006/0203546 A1 | 9/2006 | Lasser | |
| 2007/0294490 A1 | 12/2007 | Freitas et al. | |
| 2008/0239811 A1 | 10/2008 | Tanaka | |
| 2008/0313505 A1 | 12/2008 | Lee et al. | |
| 2009/0077429 A1 | 3/2009 | Yim et al. | |
| 2009/0089485 A1 | 4/2009 | Yeh | |
| 2009/0113112 A1 | 4/2009 | Ye et al. | |
| 2009/0113121 A1 | 4/2009 | Lee et al. | |
| 2009/0157952 A1 | 6/2009 | Kim et al. | |
| 2009/0182936 A1 | 7/2009 | Lee | |
| 2009/0216936 A1 | 8/2009 | Chu et al. | |
| 2009/0240873 A1 | 9/2009 | Yu et al. | |
| 2009/0327804 A1 | 12/2009 | Moshayedi | |
| 2010/0023675 A1 | 1/2010 | Chen et al. | |
| 2011/0276740 A1 * | 11/2011 | Joo et al. | 711/5 |
| 2011/0296258 A1 * | 12/2011 | Schechter et al. | 714/704 |
| 2012/0023144 A1 | 1/2012 | Rub | |
| 2012/0072654 A1 * | 3/2012 | Olbrich et al. | 711/103 |

OTHER PUBLICATIONS

"NAND Evolution and its Effects and Solid State Drive (SSD) Useable Life", Western Digital White Paper WP-001-01R, downloaded from http://www.wdc.com/WNDProducts/SSD/whitepapers/en/NAND_Evolution_0812.pdf, on Mar. 29, 2010, 16 pages.

(Continued)

*Primary Examiner* — Michael Maskulinski

(57) ABSTRACT

Embodiments of the invention are directed to systems and methods for improving wear leveling performance in solid-state memory. The embodiments described herein make more consistent the number of wear leveling operations that need to be performed, so that sudden spikes in the number wear leveling operations may be reduced in solid-state memory. In one embodiment, a rule-based wear leveling approach is used to spread out the execution of wear leveling operations that otherwise would have been triggered in clusters. Under the rule-based approach, wear leveling is periodically triggered by a specified interval of erase counts associated with a unit of solid-state memory such as a group of blocks, rather than by a threshold based on erase counts.

23 Claims, 8 Drawing Sheets

(56) References Cited

OTHER PUBLICATIONS

"Eliminating Unscheduled Downtime by Forecasting Useable Life / SiliconDrive SiSMART Technology", Western Digital White Paper WP-008-06R, downloaded from http://www.wdc.com/WDProducts/SSD/whitepapers/en/SiliconDrive_SiSMART.pdf, on Mar. 29, 2010, 8pages.

Office Action dated May 22, 2013 from U.S. Appl. No. 13/172,772, 24 pages.

* cited by examiner

Threshold-Based
Wear Leveling

FIGURE 2A

Erase Counter
Table

| SB #1 | 1 |
| SB #2 | 8 |
| SB #3 | 3 |
| SB #4 | 4 |
| SB #5 | 3 |
| SB #6 | 3 |
| SB #7 | 1 |
| SB #8 | 4 |

210

Super Block
Designation
(Set of Blocks
Distributed Across
Dies)

| SB #1 | 8 |
| SB #2 | 2 |
| SB #3 | 3 |
| SB #4 | 4 |
| SB #5 | 3 |
| SB #6 | 3 |
| SB #7 | 1 |
| SB #8 | 4 |

Wear Leveling
Swapped Blocks in These
Two SuperBlocks

Rule-Based Wear
Leveling

FIGURE 5A

|  | Blk 1 | Blk 2 | Blk 3 | Blk 4 | Blk 5 | Blk 6 | Blk 7 | Blk 8 |
|---|---|---|---|---|---|---|---|---|
| SB #1 | 1 | 1 | 1 | 1 | 1 | 1 | 1 | 1 |
| SB #2 | 6 | 6 | 6 | 6 | 6 | 6 | 6 | 6 |
| SB #3 | 3 | 3 | 3 | 3 | 3 | 3 | 3 | 3 |
| SB #4 | 4 | 4 | 4 | 4 | 4 | 4 | 4 | 4 |
| SB #5 | 4 | 4 | 4 | 4 | 4 | 4 | 4 | 4 |
| SB #6 | 3 | 3 | 3 | 3 | 3 | 3 | 3 | 3 |
| SB #7 | 1 | 1 | 1 | 1 | 1 | 1 | 1 | 1 |
| SB #8 | 4 | 4 | 4 | 4 | 4 | 4 | 4 | 4 |

Before Erase

FIGURE 5B

|  | Blk 1 | Blk 2 | Blk 3 | Blk 4 | Blk 5 | Blk 6 | Blk 7 | Blk 8 |
|---|---|---|---|---|---|---|---|---|
| SB #1 | 1 | 1 | 1 | 1 | 1 | 1 | 1 | 1 |
| SB #2 | 7 | 7 | 7 | 7 | 7 | 7 | 7 | 7 |
| SB #3 | 3 | 3 | 3 | 3 | 3 | 3 | 3 | 3 |
| SB #4 | 4 | 4 | 4 | 4 | 4 | 4 | 4 | 4 |
| SB #5 | 4 | 4 | 4 | 4 | 4 | 4 | 4 | 4 |
| SB #6 | 3 | 3 | 3 | 3 | 3 | 3 | 3 | 3 |
| SB #7 | 1 | 1 | 1 | 1 | 1 | 1 | 1 | 1 |
| SB #8 | 4 | 4 | 4 | 4 | 4 | 4 | 4 | 4 |

← SB#2 Erased

FIGURE 5C

Wear Leveling
Swapped These
Two Blocks
(Most Worn
with Least
Worn in Unit)

|  | Blk 1 | Blk 2 | Blk 3 | Blk 4 | Blk 5 | Blk 6 | Blk 7 | Blk 8 |
|---|---|---|---|---|---|---|---|---|
| SB #1 | 7 | 1 | 1 | 1 | 1 | 1 | 1 | 1 |
| SB #2 | 2 | 7 | 7 | 7 | 7 | 7 | 7 | 7 |
| SB #3 | 3 | 3 | 3 | 3 | 3 | 3 | 3 | 3 |
| SB #4 | 4 | 4 | 4 | 4 | 4 | 4 | 4 | 4 |
| SB #5 | 4 | 4 | 4 | 4 | 4 | 4 | 4 | 4 |
| SB #6 | 3 | 3 | 3 | 3 | 3 | 3 | 3 | 3 |
| SB #7 | 1 | 1 | 1 | 1 | 1 | 1 | 1 | 1 |
| SB #8 | 4 | 4 | 4 | 4 | 4 | 4 | 4 | 4 |

Selected Interval Unit
(e.g. Die, Plane, etc.)

Rule-Based Wear Leveling

FIGURE 5D

|      | Blk 1 | Blk 2 | Blk 3 | Blk 4 | Blk 5 | Blk 6 | Blk 7 | Blk 8 |
|------|-------|-------|-------|-------|-------|-------|-------|-------|
| SB #1 | 7 | 1 | 1 | 1 | 1 | 1 | 1 | 1 |
| SB #2 | 2 | 7 | 7 | 7 | 7 | 7 | 7 | 7 |
| SB #3 | 3 | 3 | 3 | 3 | 3 | 3 | 3 | 3 |
| SB #4 | 4 | 4 | 4 | 4 | 4 | 4 | 4 | 4 |
| SB #5 | 4 | 4 | 4 | 4 | 4 | 4 | 4 | 4 |
| SB #6 | 3 | 3 | 3 | 3 | 3 | 3 | 3 | 3 |
| SB #7 | 1 | 1 | 1 | 1 | 1 | 1 | 1 | 1 |
| SB #8 | 4 | 4 | 4 | 4 | 4 | 4 | 4 | 4 |

Before Erase

FIGURE 5F

Wear Leveling Swapped These Two Blocks (Most Worn with Least Worn in Unit)

|      | Blk 1 | Blk 2 | Blk 3 | Blk 4 | Blk 5 | Blk 6 | Blk 7 | Blk 8 |
|------|-------|-------|-------|-------|-------|-------|-------|-------|
| SB #1 | 7 | 8 | 1 | 1 | 1 | 1 | 1 | 1 |
| SB #2 | 3 | 2 | 8 | 8 | 8 | 8 | 8 | 8 |
| SB #3 | 3 | 3 | 3 | 3 | 3 | 3 | 3 | 3 |
| SB #4 | 4 | 4 | 4 | 4 | 4 | 4 | 4 | 4 |
| SB #5 | 4 | 4 | 4 | 4 | 4 | 4 | 4 | 4 |
| SB #6 | 3 | 3 | 3 | 3 | 3 | 3 | 3 | 3 |
| SB #7 | 1 | 1 | 1 | 1 | 1 | 1 | 1 | 1 |
| SB #8 | 4 | 4 | 4 | 4 | 4 | 4 | 4 | 4 |

Selected Interval Unit (e.g. Die, Plane, etc.)

FIGURE 5E

|      | Blk 1 | Blk 2 | Blk 3 | Blk 4 | Blk 5 | Blk 6 | Blk 7 | Blk 8 |
|------|-------|-------|-------|-------|-------|-------|-------|-------|
| SB #1 | 7 | 1 | 1 | 1 | 1 | 1 | 1 | 1 |
| SB #2 | 3 | 8 | 8 | 8 | 8 | 8 | 8 | 8 |
| SB #3 | 3 | 3 | 3 | 3 | 3 | 3 | 3 | 3 |
| SB #4 | 4 | 4 | 4 | 4 | 4 | 4 | 4 | 4 |
| SB #5 | 4 | 4 | 4 | 4 | 4 | 4 | 4 | 4 |
| SB #6 | 3 | 3 | 3 | 3 | 3 | 3 | 3 | 3 |
| SB #7 | 1 | 1 | 1 | 1 | 1 | 1 | 1 | 1 |
| SB #8 | 4 | 4 | 4 | 4 | 4 | 4 | 4 | 4 |

← SB#2 Erased

Rule-Based Wear Leveling

FIGURE 5G

|  | Blk 1 | Blk 2 | Blk 3 | Blk 4 | Blk 5 | Blk 6 | Blk 7 | Blk 8 |
|---|---|---|---|---|---|---|---|---|
| SB #1 | 7 | 8 | 1 | 1 | 1 | 1 | 1 | 1 |
| SB #2 | 3 | 2 | 8 | 8 | 8 | 8 | 8 | 8 |
| SB #3 | 3 | 3 | 3 | 3 | 3 | 3 | 3 | 3 |
| SB #4 | 4 | 4 | 4 | 4 | 4 | 4 | 4 | 4 |
| SB #5 | 4 | 4 | 4 | 4 | 4 | 4 | 4 | 4 |
| SB #6 | 3 | 3 | 3 | 3 | 3 | 3 | 3 | 3 |
| SB #7 | 1 | 1 | 1 | 1 | 1 | 1 | 1 | 1 |
| SB #8 | 4 | 4 | 4 | 4 | 4 | 4 | 4 | 4 |

Before Erase

FIGURE 5I

|  | Blk 1 | Blk 2 | Blk 3 | Blk 4 | Blk 5 | Blk 6 | Blk 7 | Blk 8 |
|---|---|---|---|---|---|---|---|---|
| SB #1 | 8 | 9 | 2 | 2 | 2 | 2 | 2 | 2 |
| SB #2 | 3 | 2 | 2 | 8 | 8 | 8 | 8 | 8 |
| SB #3 | 3 | 3 | 3 | 3 | 3 | 3 | 3 | 3 |
| SB #4 | 4 | 4 | 4 | 4 | 4 | 4 | 4 | 4 |
| SB #5 | 4 | 4 | 4 | 4 | 4 | 4 | 4 | 4 |
| SB #6 | 3 | 3 | 3 | 3 | 3 | 3 | 3 | 3 |
| SB #7 | 1 | 1 | 8 | 1 | 1 | 1 | 1 | 1 |
| SB #8 | 4 | 4 | 4 | 4 | 4 | 4 | 4 | 4 |

Wear Leveling Swapped These Two Blocks (Most Worn with Least Worn in Unit)

Selected Interval Unit (e.g. Die, Plane, etc.)

FIGURE 5H

|  | Blk 1 | Blk 2 | Blk 3 | Blk 4 | Blk 5 | Blk 6 | Blk 7 | Blk 8 |
|---|---|---|---|---|---|---|---|---|
| SB #1 | 8 | 9 | 2 | 2 | 2 | 2 | 2 | 2 |
| SB #2 | 3 | 2 | 8 | 8 | 8 | 8 | 8 | 8 |
| SB #3 | 3 | 3 | 3 | 3 | 3 | 3 | 3 | 3 |
| SB #4 | 4 | 4 | 4 | 4 | 4 | 4 | 4 | 4 |
| SB #5 | 4 | 4 | 4 | 4 | 4 | 4 | 4 | 4 |
| SB #6 | 3 | 3 | 3 | 3 | 3 | 3 | 3 | 3 |
| SB #7 | 1 | 1 | 1 | 1 | 1 | 1 | 1 | 1 |
| SB #8 | 4 | 4 | 4 | 4 | 4 | 4 | 4 | 4 |

SB#1 Erased

SYSTEM AND METHOD FOR IMPROVING WEAR-LEVELING PERFORMANCE IN SOLID-STATE MEMORY

BACKGROUND

Wear leveling is commonly used in Solid State Drives (SSDs) to prolong their lifecycle. A typical wear leveling operation involves moving data content in a first block of memory to a second block of memory that has just reached a certain erase level/count because of a recent erase operation. The first block of memory is then erased and made available for a future write operation. The overall process of wear leveling ensures that erase operations are evenly spread across blocks of memory in a SSD. Since each erase operation increases the wear of a block by incrementally reducing the block's ability to properly retain data content, wear leveling helps prevent certain blocks of memory from receiving an excessive amount of erase operations relative to other blocks and thus experiencing data failures much earlier than other blocks.

BRIEF DESCRIPTION OF THE DRAWINGS

Systems and methods which embody the various features of the invention will now be described with reference to the following drawings, in which:

FIGS. 2A and 2B are block diagrams illustrating changes to an example erase counter table in response to the triggering of a threshold-based wear leveling operation.

FIGS. 5A-5I are block diagrams that illustrate an example set of superblocks that are undergoing rule-based wear leveling operations.

DETAILED DESCRIPTION

While certain embodiments of the inventions have been described, these embodiments have been presented by way of example only, and are not intended to limit the scope of the inventions. Indeed, the novel methods and systems described herein may be embodied in a variety of other forms. Furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Overview

Embodiments of the invention are directed to systems and methods for improving wear leveling performance in solid-state memory. The embodiments described herein make more consistent the number of wear leveling operations that need to be performed, so that sudden spikes in the number wear leveling operations may be reduced in solid-state memory. In one embodiment, a rule-based wear leveling approach is used to spread out the execution of wear leveling operations that otherwise would have been triggered in clusters. Under the rule-based approach, wear leveling is periodically triggered by a specified interval of erase counts associated with a unit of solid-state memory such as a group of blocks, rather than by a threshold based on erase counts.

System Overview

Figure 1:
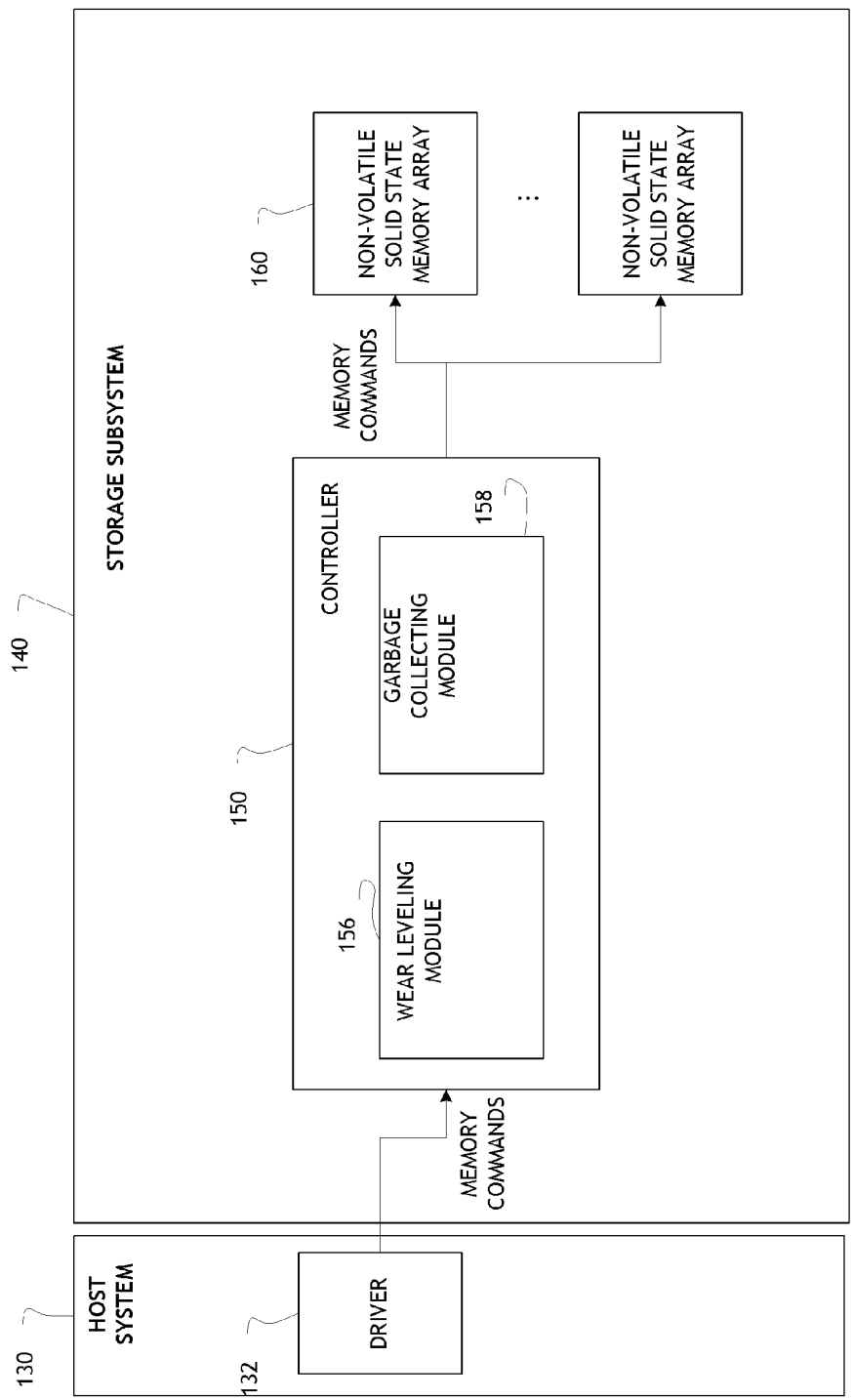
FIG. 1 is a block diagram illustrating a solid-state storage subsystem with a wear leveling module according to one embodiment.

FIG. 1 is a block diagram illustrating a storage subsystem embodiment with a wear leveling module. As shown, a storage subsystem 140 includes a controller 150, which in turn includes a wear leveling module 156 and a garbage collection module 158. In one embodiment, the wear leveling module 156 is responsible for issuing wear leveling commands and the garbage collection module is responsible for issuing garbage collection commands, with the controller 150 relaying those commands to non-volatile solid-state memory arrays 160 for execution. In one embodiment, the wear leveling module 156 is configured to select blocks for wear leveling and issue wear leveling commands in accordance with the methods described in this disclosure. In one embodiment, the controller 150 is configured to receive memory commands from a driver 132 residing on a host system 130 and execute those host-issued memory commands in the non-volatile solid-state memory arrays 160.

Wear Leveling Operations

FIGS. 2A and 2B are block diagrams illustrating changes to a simplified example erase counter table in response to the triggering of a threshold-based wear leveling operation. As the name implies, threshold-based wear leveling is triggered when a certain unit of memory (e.g., a block or superblock) reaches a particular erase count threshold. FIG. 2A shows an erase counter table 210 that tracks the erase counts recorded for various superblocks in the non-volatile memory. A superblock is a group of memory blocks, and in one embodiment, each block in a superblock is on one die of a group of dies. Other configurations are possible in other embodiments. For example, in one embodiment, a superblock is comprised of blocks from various planes in a group of dies. In the embodiment shown, the erase counter for each superblock is assumed to begin at zero and erase operations are performed by the garbage collection module 158 largely on a superblock basis.

In the simplified example of FIGS. 2A and 2B, the threshold for triggering wear leveling is 8 erase counts. In FIG. 2A, Superblock No. 2 has just been erased and reaches the threshold of 8. This means that all blocks within Superblock No. 2 are now in need of wear leveling since they all have been erased eight times. The counter table 210 in FIG. 2B shows the erase counter table after the performance of wear leveling on blocks within Superblock No. 2. Superblock No. 1 is chosen to participate in the wear leveling operation because its blocks, along with those in Superblock No. 7, have been erased the fewest number of times (i.e., they have the least wear). The wear leveling operation in this simplified example involves (1) moving the data contents of blocks in Superblock No. 1 into blocks in Superblock No. 2, (2) erasing those blocks in Superblock No. 1, and (3) swapping the assignment of blocks in Superblock Nos. 1 and 2. The wear leveling operation of blocks in Superblock Nos. 1 and 2 as shown and described is for illustration only in this simplified example, as in various embodiments the particular blocks on which wear leveling are performed are selected in accordance with a number of rules and configurations, as will be further described below. For example, a block that is due to be wear leveled may be wear leveled with another block on the same die. As illustrated in FIGS. 2A and 2B, with threshold-based wear leveling, the number of wear leveling operations that is triggered by an erase operation may be quite large. In the example, if each superblock includes 32 blocks, then 32 wear leveling operations must be performed at once when a superblock reaches a wear leveling threshold. The sudden requirement of having to perform 32 wear leveling operations may negatively impact the throughput of host-issued memory commands that the controller can handle.

Figure 3:
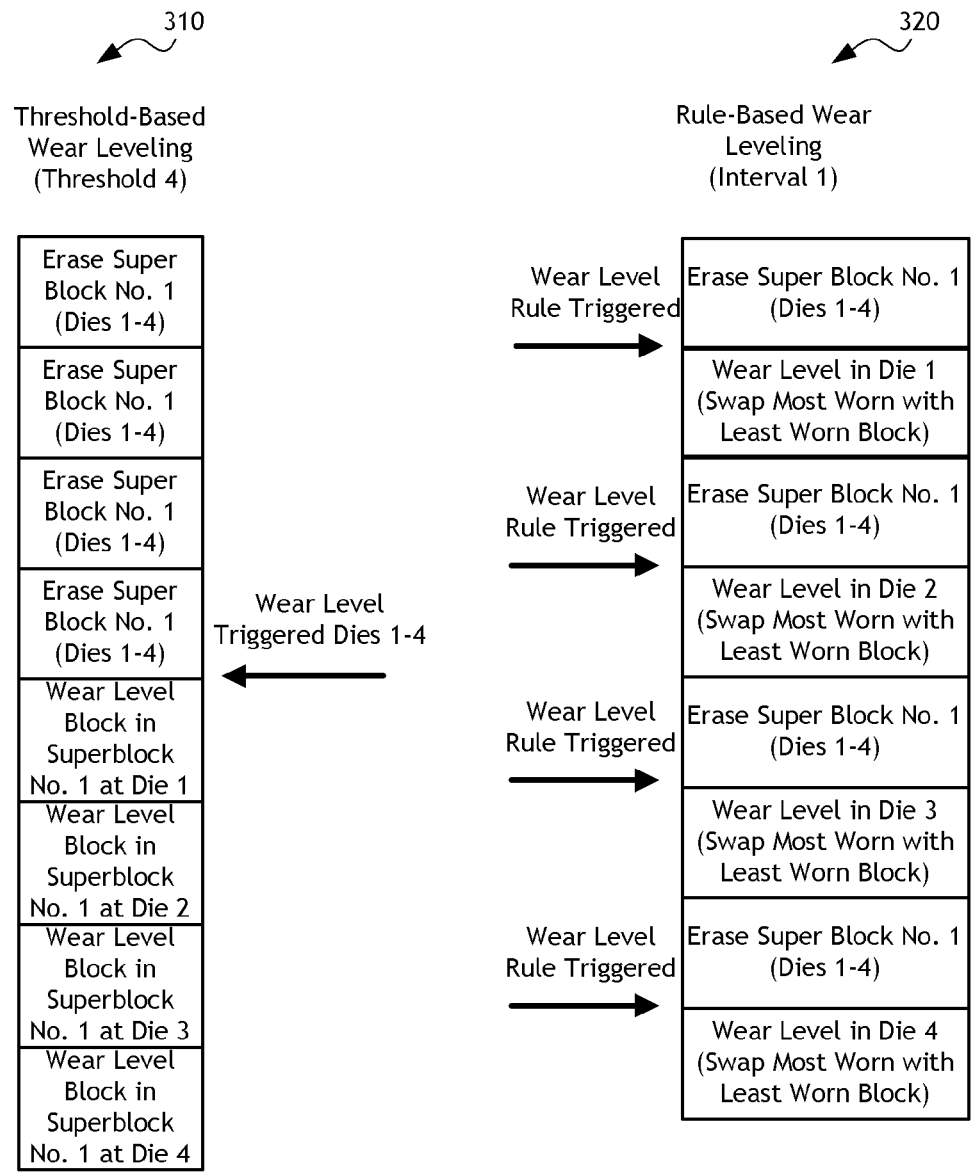
FIG. 3 is a block diagram illustrating the differences between an example sequence of events associated with a threshold-based wear leveling operation and that which is associated with a rule-based wear leveling operation in accordance with one embodiment.

FIG. 3 further illustrates the threshold-based wear leveling approach (illustration 310) and compares it to the rule-based wear leveling approach (illustration 320) in accordance with one embodiment. In the example shown in illustration 310, the threshold for wear leveling is 4, and Superblock No. 1 consists of four blocks, each from Dies No. 1-4. Both illustrations 310 and 320 are block diagrams that illustrate operations performed in sequence and arranged chronologically from top to bottom. Illustration 310 shows that four consecutive erase operations are performed on Superblock No. 1. At the end of the fourth erase operation, wear leveling is triggered for all four blocks within Superblock No. 1, and hence four wear leveling operations (one for each block in Dies No. 1-4) must be performed as shown.

Rule-Based Wear Leveling

Illustration 320 shows a different sequence under the rule-based wear leveling approach, which spreads out the execution of wear leveling operations that otherwise would have been triggered together. As its name suggests, in one embodiment, the rule-based approach ensures that the blocks in a superblock are periodically wear leveled according to a set of rules instead of being triggered by thresholds. In one embodiment blocks in a superblock are periodically wear leveled on a rotational basis even if the superblock erase counter has not yet reached a wear leveling threshold. The period in the rule-based approach is set in accordance with an interval value denoting a number of erase operations between two wear leveling operations. The interval is set to 1 in the example shown in FIG. 3. In other words, according to the example shown in FIG. 3, a wear leveling operation is performed for every one erase operation performed in the superblock, regardless of whether the wear leveling threshold has been reached. If the interval is set at 10, a wear leveling operation is performed for every ten erase operations performed in the superblock. In one embodiment, the interval value is based on the wear leveling threshold (by erase counts) divided by the number of blocks in a superblock. For example, a superblock with a threshold of 400 and 32 blocks may have the interval value set at 12. Executing the wear leveling operation periodically based on the interval and regardless of the wear levels of the individual blocks in the superblock makes the overall wear leveling deterministic. Because blocks are selected from dies or planes on a rotational basis each time wear leveling is triggered, the rule-based approach avoids the sudden need to execute a large number of wear leveling operations while ensuring that blocks are properly selected for wear leveling over a period of time for even wear.

Returning to FIG. 3, as shown in illustration 320, as the interval is set at 1, a wear leveling operation is performed for each erase operation. In the example shown, blocks from the dies are selected in a rotation fashion, with a block in Die No. 1 selected first, followed by a block in Die No. 2, and so on. In one embodiment, the block that is selected is the most worn block in the die, and the selected block is wear leveled with the least worn block in the die. The rule-based wear leveling approach will be further described in FIG. 4.

Figure 4:
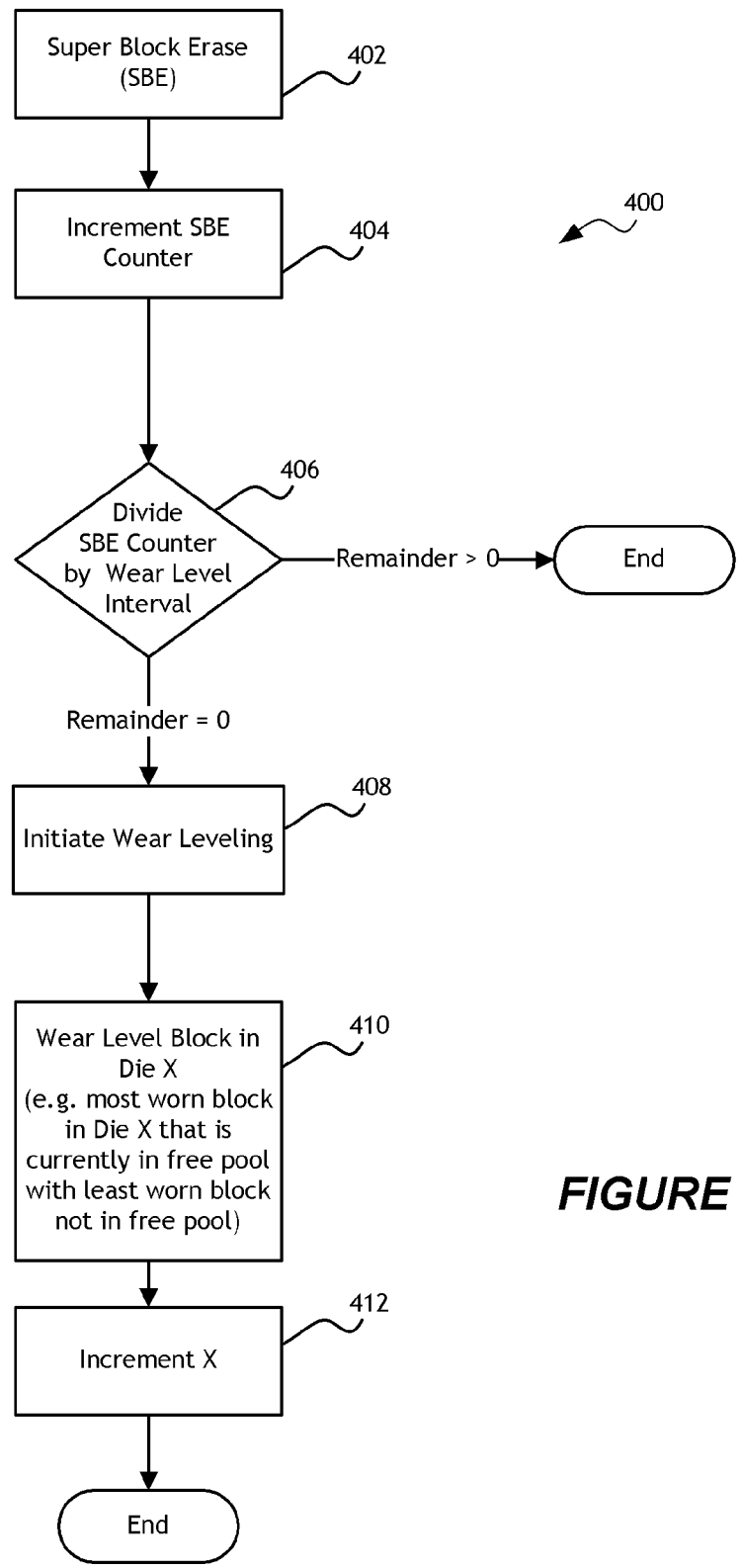
FIG. 4 is a flow diagram showing the process of rule-based wear leveling in accordance with one embodiment.

FIG. 4 is a flow diagram showing a process 400 of rule-based wear leveling in accordance with one embodiment. At block 402, an erase operation is performed on a superblock. At block 404, a superblock erase counter is incremented in response to the erase operation. At block 406, the value of the superblock erase counter is divided by a wear level interval, and the process 400 determines whether the remainder is zero. If it is not, the process terminates and waits until the next erase operation is performed on the same superblock, at which time the process will begin anew at block 400. If the remainder is zero, the process 400 moves to block 408, where a wear leveling operation is initiated. In one embodiment, the determination in block 406 is performed through a modulo operation on the superblock erase counter and the wear level interval. In other embodiments, the wear level interval may be a set time period or a set number of erase counts and the determination as to whether a wear leveling operation should be performed is made in accordance with the type of wear level interval used. Also, in some embodiments, the interval may be dynamically adjusted in accordance with the overall wear level of the solid-state memory and/or the amount of static data within the memory.

At block 410, a block within a selected die is wear leveled with another block within the same die. The die is selected based on a current die index (represented by a value X in FIG. 4). In one embodiment, the wear leveling operation selects the most worn block on the selected die that is currently in the free pool, and performs wear leveling with the least worn block on the die that is not in the free pool. In one embodiment, the free pool stores blocks that are available for writing. Blocks that are not in the free pool contain valid data and are otherwise not available for writing. Returning to FIG. 4, once the wear leveling operation is complete, the current die index is incremented at block 412 so a block from the next die in the rotation is selected in the next wear leveling operation, and the process 400 ends.

FIGS. 5A-5H are block diagrams that illustrate an example set of superblocks that are undergoing rule-based wear leveling operations. The tables in FIGS. 5A-5H show the erase counters for eight example superblocks (Superblocks Nos. 1-8). Each example superblock has eight blocks, which are tracked across the columns as Blocks Nos. 1-8. In one embodiment, each block of Blocks Nos. 1-8 is located on a different die or plane, though for the purpose of illustration they will be described as being located on a different die of Dies Nos. 1-8. In addition, in the example of FIGS. 5A-5H, the wear level interval is set at 1. FIG. 5A shows the state of the superblocks before an erase operation is performed. FIG. 5B shows that Superblock No. 2 is erased, and the erase counters for Superblock No. 2 are incremented (a process previously shown in block 404 of FIG. 4). Because the wear level interval is 1 in this example, a wear leveling operation is initiated. In one embodiment, the wear leveling operation is performed on a rotational basis, and in this example the wear leveling moves sequentially from Die No. 1 to Die No. 8. Therefore, in FIG. 5C, a wear leveling operation is performed on Die No. 1.

In one embodiment, two different types of wear leveling operations may be performed: static and dynamic. In static wear leveling, the most worn block on a die is wear leveled with the least worn block on the die. In dynamic wear leveling, the most worn block on a die in the free pool is wear leveled with the least worn block on the die that contains valid data (i.e., not in the free pool). FIG. 5C illustrates dynamic wear leveling, so the block assigned to Superblock No. 2 on Die No. 1 is selected for wear leveling because it has the highest erase count and Superblock No. 2 has just been erased. The wear leveling operation moves data from the least worn block with valid data on Die No. 1 (the block assigned to Superblock No. 1) to the block assigned to Superblock No.

2, and then erases the block assigned to Superblock No. 1. Then the superblock assignments of the two blocks are switched so that the block assigned to Superblock No. 1 is re-assigned to Superblock No. 2 and vice versa. The updated erase counts are shown in FIG. 5C. After the wear leveling is complete, the current die index is incremented (as previously shown in block 412 of FIG. 4).

FIGS. 5D-5F illustrate the next erase cycle, with FIG. 5D showing the state of the superblocks before the next erase operation. FIG. 5E shows that Superblock No. 2 is erased again. Because the wear level interval is one, the erase operation necessitates a wear leveling operation. In FIG. 5F, wear leveling is now performed on Die No. 2 (as a result of the current die index having been previously incremented). As discussed above, dynamic wear leveling in one embodiment is performed on the most worn of all blocks on a die that are in the free pool. In FIG. 5F, of all the blocks in Die No. 2, the block assigned to Superblock No. 2 is selected because, prior to the performance of the wear leveling operation, it has the highest erase count (most worn) and Superblock No. 2 has just been erased. The wear leveling operation moves data from the least worn block on Die No. 2 (the block assigned to Superblock No. 1) to the block assigned to Superblock No. 2, and then erases the block assigned to Superblock No. 1. Then the superblock assignments of the two blocks are switched so that the block assigned to Superblock No. 1 is re-assigned to Superblock No. 2 and vice versa. The updated erase counts are shown in FIG. 5F. After the wear leveling is complete, the current die index is again incremented.

FIGS. 5G-5I illustrate the next erase cycle, with FIG. 5G showing the state of the superblocks before the next erase operation. FIG. 5H shows that Superblock No. 1 is erased this time. Because the wear level interval is one, the erase operation necessitates another wear leveling operation. In FIG. 5I, wear leveling is now performed on Die No. 3 (as a result of the current die index having been previously incremented). In FIG. 5I, the wear leveling operation moves data from the least worn block with valid data on Die No. 3 (the block assigned to Superblock No. 7) to the block assigned to Superblock No. 2 (most worn block on Die No. 3 in the free pool), and then erases the block assigned to Superblock No. 7. Then the superblock assignments of the two blocks are switched so that the block assigned to Superblock No. 7 is re-assigned to Superblock No. 2 and vice versa. The updated erase counts are shown in FIG. 5I.

Figure 6:
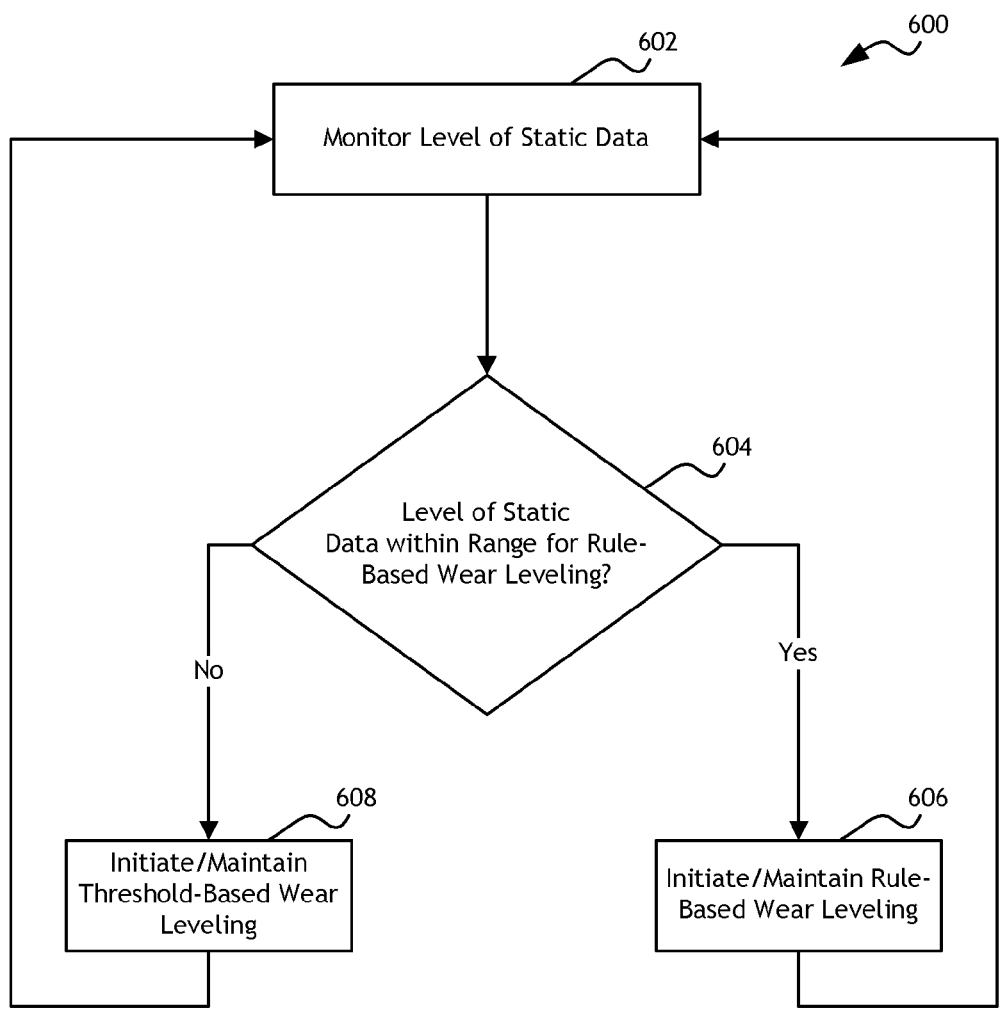
FIG. 6 is a flow diagram showing the process of switching between threshold-based wear leveling and rule-based wear leveling in accordance with one embodiment.

FIG. 6 is a flow diagram showing a process 600 of switching between threshold-based wear leveling and rule-based wear leveling in accordance with one embodiment. In one embodiment, the switching between the two methods of wear leveling is intended to maximize performance of the storage subsystem, since each wear leveling method has an associated percentage range of static data in the overall memory in which the method performs optimally, i.e., the wear leveling operations triggered by the method are evenly distributed with respect to time. In one embodiment, as shown in block 602, the controller 150 and/or the wear leveling module 156 is configured to perform process 600, which continuously and/or periodically monitors the level of static data that is present in the non-volatile memory arrays 160. The level of static data may be determined in a variety of ways, including using an invalid page counter based on information from an invalid page table to determine the amount of invalid data stored. For example, a superblock that has a zero invalid page counter may be considered to have static data, and the percentage of static data may be calculated by summing the number of superblocks that have such zero counters. At block 604, the process 600 determines whether the level of static data is within a range that is suitable for rule-based wear leveling. If so, it initiates rule-based wear leveling (or maintains it if it is already using it) at block 606. Otherwise, it initiates threshold-based wear leveling (or maintains it if it is already using it) at block 608. In either case, the process returns to block 600. In one embodiment, the process shown in FIG. 6 is performed periodically, for example, in accordance with a time interval or an interval based on a total erase count of the storage subsystem. In one embodiment, the range of static data in which rule-based wear leveling is used is 10%-25%.

CONCLUSION

The features and attributes of the specific embodiments disclosed above may be combined in different ways to form additional embodiments, all of which fall within the scope of the present disclosure. Although the present disclosure provides certain embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A method of performing wear leveling operations in a non-volatile solid-state storage subsystem that comprises blocks of memory, the method comprising:

receiving a command that specifies an erase operation on a superblock of a plurality of superblocks in the storage subsystem, said superblock comprising a plurality of blocks, each block residing in a die of a plurality of dies in the storage subsystem and being capable of having a wear leveling operation being performed on the block independently of other blocks in said superblock;

incrementing a superblock erase counter associated with said superblock to reflect said erase operation on the superblock; and using said superblock erase counter to control a timing with which wear leveling operations are performed on specific blocks in a die of said plurality of dies, the timing being determined by comparing said superblock erase counter to an interval threshold, the interval threshold being smaller than a threshold denoting a minimum frequency at which a wear leveling operation is to be performed on a block.

2. The method of claim 1, wherein the die on which each of the wear leveling operations is performed is selected in accordance with a rotation.

3. The method of claim 1, further comprising:

determining an amount of static data stored in the storage subsystem; and in response to determining that the amount of static data is within a range, altering the determining of the timing with which the wear leveling operations are performed by basing the timing on a comparison of the superblock erase counter to the threshold.

4. A storage subsystem capable of regulating a maximum number of wear leveling operations triggered by an erase operation, the storage subsystem comprising:

a non-volatile memory storage array comprising a plurality of memory units, each memory unit including a plurality of memory sub-units, each memory sub-unit being a unit of memory on which a wear leveling operation is performed; and a controller configured to receive a plurality of erase commands associated with a set of memory sub-units, the set comprising at least one memory sub-unit from each of the plurality of memory units, wherein one or more of the plurality of erase commands is configured to cause the set of memory sub-units to be erased;

wherein the controller is configured to determine whether to perform a wear leveling operation on a memory sub-unit within one of the plurality of memory units based at least on a relationship between (1) a number of erase commands performed on the set of memory sub-units, and (2) a wear level interval associated with the set of memory sub-units, the wear level interval being based on a number of memory sub-units in the set and a wear leveling threshold denoting a minimum frequency at which a wear leveling operation is to be performed on a memory sub-unit.

5. The storage subsystem of claim 4, wherein each memory unit is a die, each memory sub-unit is a block, and the set of memory sub-units is a superblock.

6. The storage subsystem of claim 5, wherein the wear leveling operation comprises an operation to swap data between the most and least worn blocks associated with a die on which wear leveling operation is performed.

7. The storage subsystem of claim 5, wherein the wear leveling operation comprises an operation to swap data between the most worn block in a die on which wear leveling operation is performed that is in a free pool and the least worn block in the die that is not in the free pool.

8. The storage subsystem of claim 5, wherein each determination to perform a wear leveling operation is made with respect to a die.

9. The storage subsystem of claim 5, wherein the die associated with the wear leveling operation is determined with respect to a rotation.

10. The storage subsystem of claim 9, wherein the rotation comprises traversing a plurality of dies associated with the set of blocks.

11. The storage subsystem of claim 4, wherein each memory unit is a plane, each memory sub-unit is a block, and the set of memory sub-units is a superblock.

12. The storage subsystem of claim 4, wherein the controller is configured to determine the relationship by performing a modulo operation on the number of erase commands performed and the wear level interval.

13. The storage subsystem of claim 12, wherein the controller is configured to perform the wear leveling operation when the modulo operation on the number of erase commands performed and the wear level interval results in a zero remainder.

14. The storage subsystem of claim 12, wherein the controller is configured to not perform the wear leveling operation when the modulo operation on the number of erase commands performed and the wear level interval results in a non-zero remainder.

15. A storage subsystem, comprising:
a non-volatile memory storage array, the non-volatile memory storage array comprising a plurality of dies, each die including a plurality of blocks; and
a controller configured to:
receive an erase command associated with a set of blocks, the set of blocks comprising at least one block from each of the plurality of dies; and
perform a wear leveling operation, the wear leveling operation being triggered by a condition and being directed to a die that is chosen with reference to a rotation associated with the plurality of dies, the rotation being advanced by the performance of the wear leveling operation,
wherein the condition is based at least on a relationship between a number of erase commands associated with the set of blocks and a wear level interval threshold, the wear level interval threshold being smaller than a threshold denoting a minimum frequency at which the wear leveling operation is to be performed on a block.

16. The storage subsystem of claim 15, wherein the condition is based at least on a result of a modulo operation with the number of erase commands and a wear level interval.

17. The storage subsystem of claim 16, wherein the number of erase commands is maintained by a counter.

18. A method for regulating a maximum number of wear leveling operations triggered by an erase operation in a non-volatile storage subsystem comprising a plurality of memory units, each memory unit including a plurality of memory sub-units, each memory sub-unit being a unit of memory on which a wear leveling operation is performed, the method comprising:
receiving, at a controller of the non-volatile storage subsystem, a plurality of erase commands associated with a set of memory sub-units, the set of memory sub-units comprising at least one memory sub-unit from each of the plurality of memory units, each erase command being configured to cause the set of memory sub-units to be erased; and
determining, by the controller, whether to perform a wear leveling operation on a memory sub-unit within one of the plurality of memory units based at least partially on a relationship between a number of erase commands performed on the set of memory sub-units and a wear level interval associated with the set of memory sub-units, the wear level interval being based on a number of memory sub-units in the set.

19. The method of claim 18, wherein each memory unit is a die and each memory sub-unit is a block.

20. The method of claim 19, wherein the wear leveling operation comprises an operation to swap data between the most worn block in a die on which the wear leveling operation is performed that is in a free pool and the least worn block in the die that is not in the free pool.

21. The method of claim 19, wherein the die on which the wear leveling operation is performed is determined with respect to a rotation determined by traversing a plurality of dies associated with the set of blocks.

22. The method of claim 18, wherein determining the relationship further comprises performing a modulo operation on the number of erase commands performed and the wear level interval.

23. The method of claim 22, further comprising: performing a wear leveling operation in response to determining that the modulo operation on the number of erase commands performed and the wear level interval results in a zero remainder.

* * * * *